United States Patent
Trulli et al.

(10) Patent No.: US 11,152,279 B2
(45) Date of Patent: Oct. 19, 2021

(54) MONOLITHIC MICROWAVE INTEGRATED CIRCUIT (MMIC) COOLING STRUCTURE

(71) Applicant: Raytheon Company, Waltham, MA (US)

(72) Inventors: Susan C. Trulli, Lexington, MA (US); Anurag Gupta, Canton, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/935,622

(22) Filed: Mar. 26, 2018

(65) Prior Publication Data

US 2019/0295918 A1 Sep. 26, 2019

(51) Int. Cl.
| | |
|---|---|
| *H01L 23/367* | (2006.01) |
| *H01L 23/46* | (2006.01) |
| *H01L 23/66* | (2006.01) |
| *H01L 23/00* | (2006.01) |
| *H01L 23/373* | (2006.01) |
| *F28F 21/02* | (2006.01) |

(52) U.S. Cl.
CPC .......... *H01L 23/3675* (2013.01); *F28F 21/02* (2013.01); *H01L 23/3733* (2013.01); *H01L 23/3735* (2013.01); *H01L 23/46* (2013.01); *H01L 23/66* (2013.01); *H01L 24/32* (2013.01); *H01L 2223/6611* (2013.01); *H01L 2223/6627* (2013.01); *H01L 2223/6644* (2013.01); *H01L 2223/6661* (2013.01); *H01L 2223/6683* (2013.01); *H01L 2224/32245* (2013.01); *H01L 2924/10272* (2013.01); *H01L 2924/1423* (2013.01)

(58) Field of Classification Search
CPC .............. H01L 2223/6683; H01L 2924/1423
See application file for complete search history.

(56) References Cited

U.S. PATENT DOCUMENTS

| | | | |
|---|---|---|---|
| 3,156,091 A | 11/1964 | Kraus | |
| 3,980,105 A | 9/1976 | Myskowski | |

(Continued)

FOREIGN PATENT DOCUMENTS

| | | |
|---|---|---|
| DE | 10 2011 078 674 A1 | 1/2013 |
| EP | 1 783 833 A2 | 5/2007 |

(Continued)

OTHER PUBLICATIONS

PCT International Search Report and Written Opinion dated Jan. 9, 2017 for International Application No. PCT/US2016/054290; 9 pages.
Whelan, et al.; GaN Technology for Radars. CS Mantech Conference, Apr. 23-26, 2012, Boston, Massachusetts, USA. 4 pages.
Office Action dated Sep. 28, 2018 for U.S. Appl. No. 15/870,155; 10 Pages.

(Continued)

*Primary Examiner* — Walter H Swanson
(74) *Attorney, Agent, or Firm* — Daly, Crowley, Mofford & Durkee, LLP

(57) ABSTRACT

A Monolithic Integrated Circuit (MMIC) cooling structure having a heat spreader thermally comprising a anisotropic material, such material having anisotropic heat conducting properties for conducing heat therethrough along a preferred plane, a surface of the MMIC being thermally coupled to the heat spreader, the preferred plane intersecting the surface of the MMIC; and, a thermally conductive base having a side portion thermally coupled to the heat spreader, the side portion being disposed in a plane intersecting the preferred plane.

41 Claims, 12 Drawing Sheets

(56) References Cited

U.S. PATENT DOCUMENTS

| | | | |
|---|---|---|---|
| 4,057,610 A | 11/1977 | Goettler et al. | |
| 4,627,472 A | 12/1986 | Goettler et al. | |
| 5,434,362 A | 7/1995 | Klosowiak et al. | |
| 5,545,924 A | 8/1996 | Contolatis et al. | |
| 6,075,701 A | 6/2000 | Ali et al. | |
| 6,387,462 B1 | 5/2002 | Blain et al. | |
| 6,674,347 B1 | 1/2004 | Maruhashi et al. | |
| 6,717,813 B1 | 4/2004 | Garner | |
| 7,005,554 B2 | 2/2006 | Levi et al. | |
| 7,303,005 B2 | 12/2007 | Reis et al. | |
| 9,318,450 B1 | 4/2016 | Reza et al. | |
| 9,889,624 B2 | 2/2018 | Trulli | |
| 10,232,582 B2 | 3/2019 | Trulli | |
| 2002/0006523 A1 | 1/2002 | Obeshaw | |
| 2002/0167800 A1 | 11/2002 | Smale | |
| 2003/0042153 A1 | 3/2003 | Farrar et al. | |
| 2003/0116312 A1 | 6/2003 | Krassowski et al. | |
| 2006/0096740 A1 | 5/2006 | Zheng | |
| 2007/0053168 A1 | 3/2007 | Sayir et al. | |
| 2009/0066420 A1 | 3/2009 | Lopez | |
| 2009/0091892 A1 | 4/2009 | Otsuka et al. | |
| 2010/0177796 A1 | 7/2010 | Miller | |
| 2011/0030924 A1 | 2/2011 | Kawabata et al. | |
| 2013/0092354 A1 | 4/2013 | Semenov et al. | |
| 2013/0271905 A1 | 10/2013 | Sullivan | |
| 2013/0308274 A1* | 11/2013 | Murdock | H05K 7/205 361/717 |
| 2015/0062802 A1 | 3/2015 | Grunow et al. | |
| 2015/0253089 A1* | 9/2015 | Fan | B32B 15/04 165/185 |
| 2015/0262905 A1* | 9/2015 | Salamon | H01L 23/473 257/713 |
| 2016/0049351 A1* | 2/2016 | McCann | H01L 23/3732 257/76 |
| 2016/0276242 A1* | 9/2016 | Trulli | H01L 23/34 |
| 2017/0042058 A1* | 2/2017 | Pope | H05K 7/205 |
| 2017/0100907 A1 | 4/2017 | Trulli | |
| 2019/0313522 A1 | 10/2019 | Trulli et al. | |

FOREIGN PATENT DOCUMENTS

| | | |
|---|---|---|
| EP | 1 783 833 A3 | 1/2009 |
| EP | 2454551 A | 5/2012 |
| JP | 2001-267441 A | 9/2001 |
| JP | 2001267441 A | 9/2001 |
| JP | 2001267441 A | 9/2001 |
| WO | WO 2011/008467 A1 | 1/2011 |

OTHER PUBLICATIONS

Terminal Disclaimer and Response to Office Action dated Sep. 28, 2018 for U.S. Appl. No. 15/870,155, filed Oct. 4, 2018; 8 Pages.

PCT Invitation to Pay Additional Fees and Partial Search Report dated Oct. 18, 2019 for International Application No. PCT/US2019/016282; 16 Pages.

Darwish et al.; Three Dimensional Transmission Lines and Power Divider Circuits. Apr. 1, 2009; 8 pages.

Gries; Photonics Applied: Microelectronics Processing: Laser direct structuring creates low-cost 3D integrated circuits. Oct. 10, 2010; 6 pages.

Tehran et al.; Inkjet-Printed 3D Interconnects for Millimeter-Wave System-on-Package Solutions. 2016 IEEE MTT-S International Microwave Symposium (IMS), San Francisco, CA; Jan. 1, 2016; 4 pages.

Notification of Transmittai of the International Search Report and the Written Opinion of the ISA dated Jul. 2, 2019 for International Application No. PCT/US2019/023988; 1 page.

International Search Report dated Jul. 2, 2019 for International Application No. PCT/US2019/023988; 5 pages.

Written Opinion of the ISA dated Jul. 2, 2019 for International Application No. PCT/US2019/023988; 12 pages.

Office Action dated Nov. 6, 2019 for U.S. Appl. No. 15/948,404, 21 pages.

Response to Office Action dated Nov. 6, 2019 for U.S. Appl. No. 15/948,404, 11 pages.

Notification of Transmittal of the International Search Report and the Written Opinion of the ISA dated Dec. 9, 2019 for International Application No. PCT/US2019/016282; 1 page.

International Search Report dated Dec. 9, 2019 for International Application No. PCT/US2019/016282; 7 pages.

Written Opinion of the ISA dated Dec. 9, 2019 for International Application No. PCT/US2019/016282; 13 pages.

Taiwan Office Action with English Translation dated Aug. 18, 2020 for Taiwan Patent Application No. 108105616, 31 pages.

Search Report dated Aug. 17, 2020 for Taiwan Patent Application No. 108105616, 1 page.

Notification Concerning Transmittal of International Preliminary Report on Patentability (Chapter I of the Patent Cooperation Treaty) dated Oct. 8, 2020 for International Application No. PCT/US2019/016282; 1 page.

International Preliminary Report on Patentability, dated Sep. 29, 2020, for International Application No. PCT/US2019/016282; 1 pages.

Written Opinion of the ISA dated Oct. 8, 2020, for International Application No. PCT/US2019/016282; 11 pages.

* cited by examiner

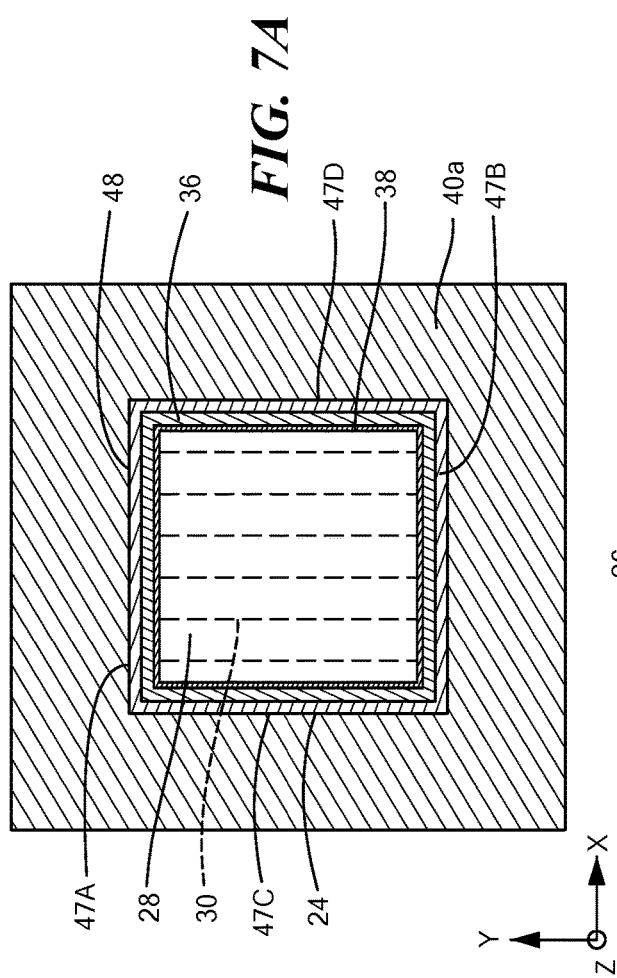
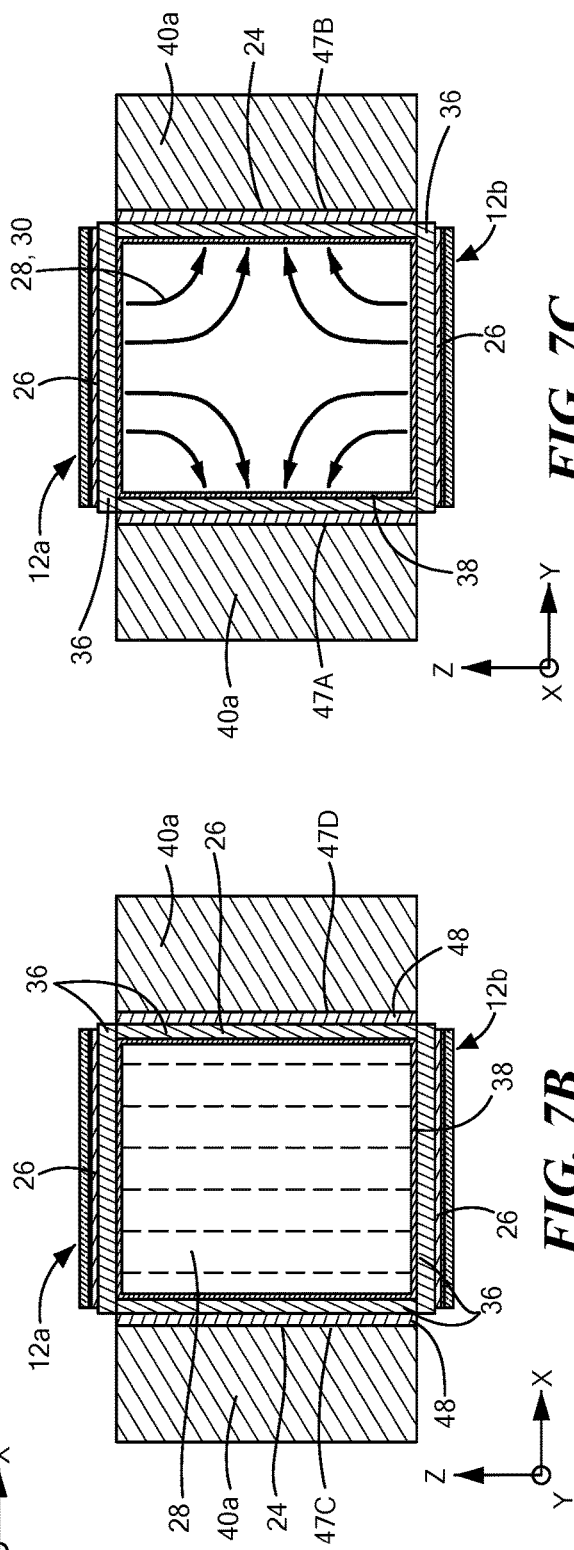

MONOLITHIC MICROWAVE INTEGRATED CIRCUIT (MMIC) COOLING STRUCTURE

TECHNICAL FIELD

This disclosure relates generally to Monolithic Integrated Circuit (MMIC) cooling structures.

BACKGROUND

As is known in the art, one technique used to cool Monolithic Microwave Integrated Circuits (MMICs) include a substrate, such as Gallium Arsenide, Gallium Nitride, Silicon, or Silicon Carbide, having active, heat generating device, such as transistors, formed in a semiconductor region of the upper surface of the substrate, and passive devices, such as transmission lines, resistors, inductors, and capacitors, formed on the upper surface of the substrate. The bottom surface of the MMIC substrate is bonded, and thermally coupled to a highly thermally conductive structure, such as a package base/cold plate, as shown in FIGS. 1A-1C, where the MMIC (die) is attached to the top, flat surface of the thermally conductive structure that is typically slightly larger than the MMIC. In some cases, the MIMIC is affixed (bonded) to a thermally conductive structure having a base/cold plate directly using a Thermal Interface Material (TIM), such as solder, as shown in FIG. 1A; however, because the surface of the MMIC and other circuit are at substantially different levels, connecting the MIMIC to such circuit elements, as for example with bond wires, creates unwanted radio frequency (RF) coupling, impedance control or high inductance issues. Also, attaching the MMIC directly to a package base may not be thermally efficient due to high heat fluxes generated in the MMIC or may limit rework options.

Another technique, as shown in FIG. 1B is to attach the MMIC and attach a thermally conductive structure having a package base/cold plate arrangement as shown in FIG. 1B. This technique allows for re-work and the thermally conductive structure height can be adjusted to improve planarity between the MMIC and other circuit elements; however, such an arrangement can add thermal resistance in certain configurations because of the increased thickness between the MMIC and the package base and due to the added Thermal Interface Material (TIM). Still another technique, as shown in FIG. 1C, is to provide a separate cold plate and mount the MMIC with the attached thermally conductive structure onto the package base and then attach that to a separate cold plate; however an additional thermal interface resistance is created.

As is also known in the art Pyrolytic Graphite Sheets (PGS), graphite has been used as thermally conductive structure, as shown FIG. 1D. Here, the PGS graphite is disposed between a heat sink, or cold plate, and a heat source; both the heat sink and heat source being thermally coupled to the PGS graphite. The PGS graphite has anisotropic heat conducting properties for conducing heat therethrough in the basal planes of the PGS graphite. Here, the basal planes are disposed in planes parallel to the planar, upper surface of the heat source to which the PGS graphite is attached; that is, the basal planes of the PGS graphite are parallel to the upper surface of the heat source and the bottom surface of the heat sink; thus, the preferred directions of the heat flow though the PGS graphite is an anisotropic heat conducting properties for conducing heat therethrough along directions parallel to the upper surface of the heat source and the bottom surface of the heat sink. See also U.S. Pat. No. 7,303,005 issued Dec. 4, 2017 inventors Reis et al. See also U. S. patent Application Publication No. U. S 2003/0116312 A1, publication date Jun. 26, 2003.

As is also known in the art, ultra-high conductivity thermally conductive structures such as diamond are often used; however these thermally conductive structures are costly and the low thermal expansion of diamond can create undesirable mechanical strain on the interface materials and/or require lower thermally-performing, stress absorbing materials to handle the thermal expansion mismatch from diamond to the typically higher expansion ceramics such as Si or SiC on the device side; and metals such as copper or aluminum for the thermally conductive base.

SUMMARY

In accordance with the present disclosure, a Monolithic Integrated Circuit (MMIC) cooling structure is provided, comprising: a MMIC; a heat spreader comprising an anisotropic material, such material having anisotropic heat conducting properties for conducing heat therethrough in a preferred plane, the bottom surface of the MMIC being thermally coupled to the heat spreader, the preferred plane intersecting the bottom surface of the MMIC; and, a thermally conductive base having a side portion thermally coupled to the heat spreader, the side portion being disposed in a plane intersecting the preferred plane.

In one embodiment, a Monolithic Integrated Circuit (MMIC) cooling structure is provided, comprising: a MMIC having an upper surface and an opposing bottom surface; a heat spreader comprising an anisotropic material, such material having anisotropic heat conducting properties for conducing heat therethrough in a preferred plane, the bottom surface of the MMIC being thermally coupled to the heat spreader, such bottom surface intersecting the preferred plane and, a thermally conductive base having a side portion thermally coupled to the heat spreader, the side portion being disposed in a plane intersecting preferred plane.

In one embodiment the cooling structure includes a second MMIC, the second MMIC having a surface thermally coupled to the heat spreader, the preferred plane intersecting the surface of the second MMIC.

In one embodiment, the thermally anisotropic material is encapsulated within a thermally conductive material.

In one embodiment, the heat spreader is embedded into a surface of the thermally conductive base.

In one embodiment, the heat spreader has basal planes and wherein the preferred plane is in the basal plane.

In one embodiment, a plurality of active, heat generating devices is in the upper surface, such plurality of active, heat generating devices being disposed along a line, such line intersecting to the preferred plane.

In one embodiment, the thermally anisotropic material is bonded to a thermally conductive encapsulation material through a bonding material external to the thermally anisotropic material.

In one embodiment, the thermally anisotropic material is thermo-compression bonded to a thermally conductive encapsulation material.

In one embodiment, a Monolithic Integrated Circuit (MMIC) cooling structure is provided, comprising: a MMIC; a heat spreader having anisotropic heat conducting properties for conducting heat therethrough along a preferred plane, a bottom surface of the MMIC being bonded to an upper surface of the heat spreader with a first layer of a thermal interface material, the conducting properties of the heat spreader for conducting heat therethrough being along a preferred plane intersecting the bottom surface of the MMIC; and a thermally conductive base having isotropic heat conducting properties, the thermally conductive base having a cavity in an upper surface, wherein a surface of the head spreader, different from the upper surface of the heat spreader, is bonded to sidewall surfaces of the cavity of the thermally conductive base with a second layer of a thermal interface material.

With such an arrangement, the thermally anisotropic high conductivity material and encapsulating material, together forming the heat spreader, have thermal conducting properties for maximizing heat transfer from the heat generating MMIC into the heat sink, or the cold plate. The mechanical properties of the encapsulation materials, typically that of the coefficient of thermal expansion, can also be tailored by choosing a preferred material of encapsulation or a variety of encapsulation materials in any given embodiment to minimize thermal stresses in the MMIC cooling structure and/or for its integration into the next higher assembly. As for the thermally anisotropic high conductivity material, the high thermally conductive basal planes are oriented not parallel to the surface of the MMIC but rather in planes that intersect the surface of the MMIC. With such a MMIC cooling configuration, the heat spreader thickness is increased to maximize contact area to the thermally conductive base. The area of heat transfer conductivity is thereby greatly increased without reducing the surface area for other circuitry beyond the approximate MMIC die size cut-out and without adding an additional thermal interface. It also allows rework and maintains planarity of the MMIC interconnects with the off chip circuit for improved RF performance.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 5A being a perspective view of the cooling structure of FIG. 2; FIG. 5B being a top view in the X-Y plane of the cooling structure of FIG. 2; FIGS. 5C and 5D being cross sectional views in the Y-Z and X-Z planes passing through lines 5C-5C and 5D-5D, respectively in FIG. 5A of the cooling structure of FIG. 2; and FIG. 5E being a side view of the cooling structure of FIG. 2, such side view being along a direction parallel to the Y axis in FIG. 5A;

FIGS. 7A, 7B and 7C are top and side cross sectional views of the Monolithic Integrated Circuit (MMIC) cooling structure of FIG. 7 according to the other embodiment of the disclosure;

Like reference symbols in the various drawings indicate like elements.

DETAILED DESCRIPTION

Figure 1A:
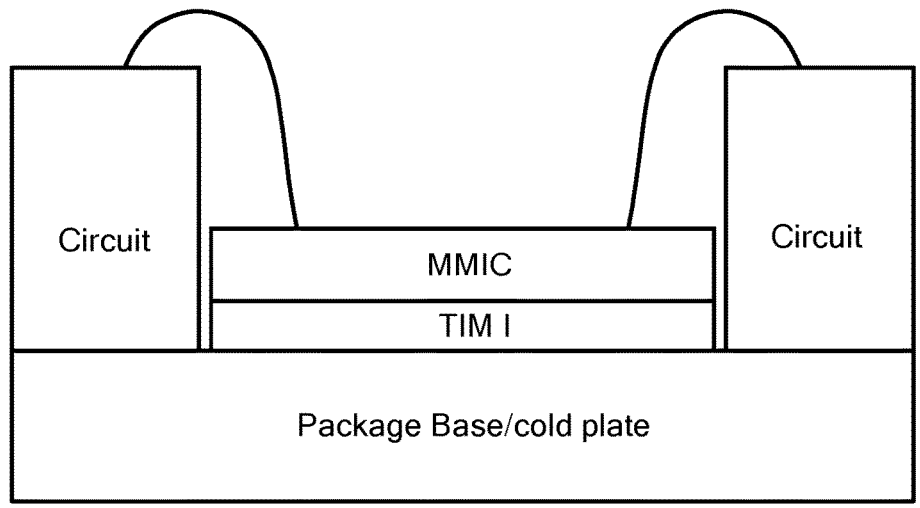
FIGS. 1A-1C are cross sectional diagrammatical sketches of Monolithic Integrated Circuit (MMIC) cooling structures according to the PRIOR ART.
Figure 1B:
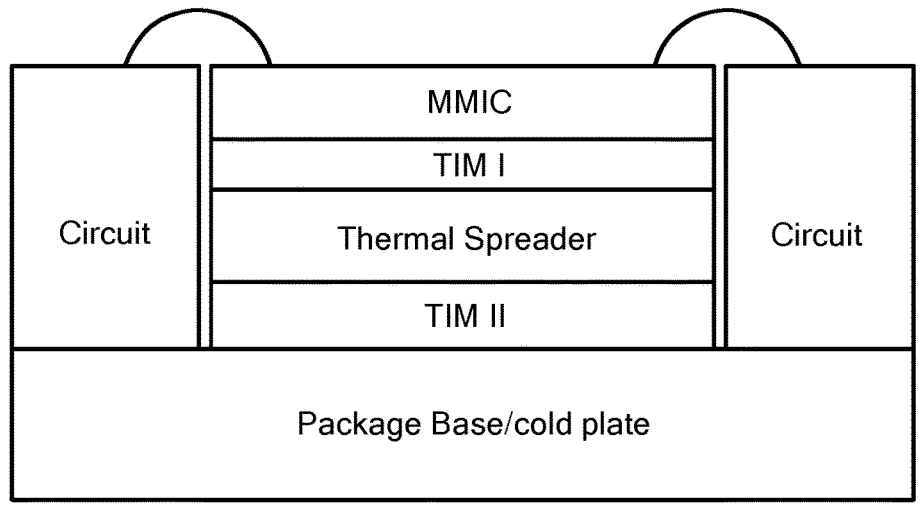
Figure 1C:
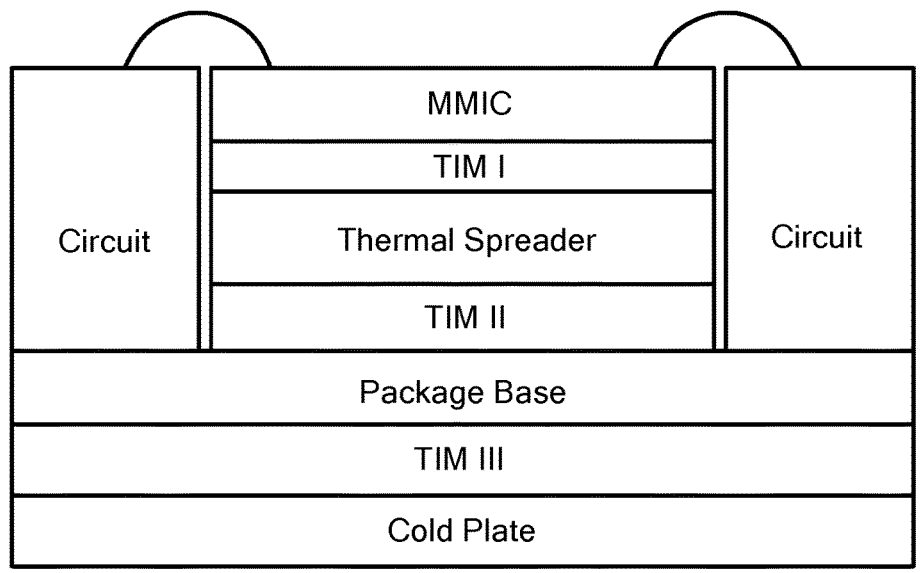
Figure 1D:
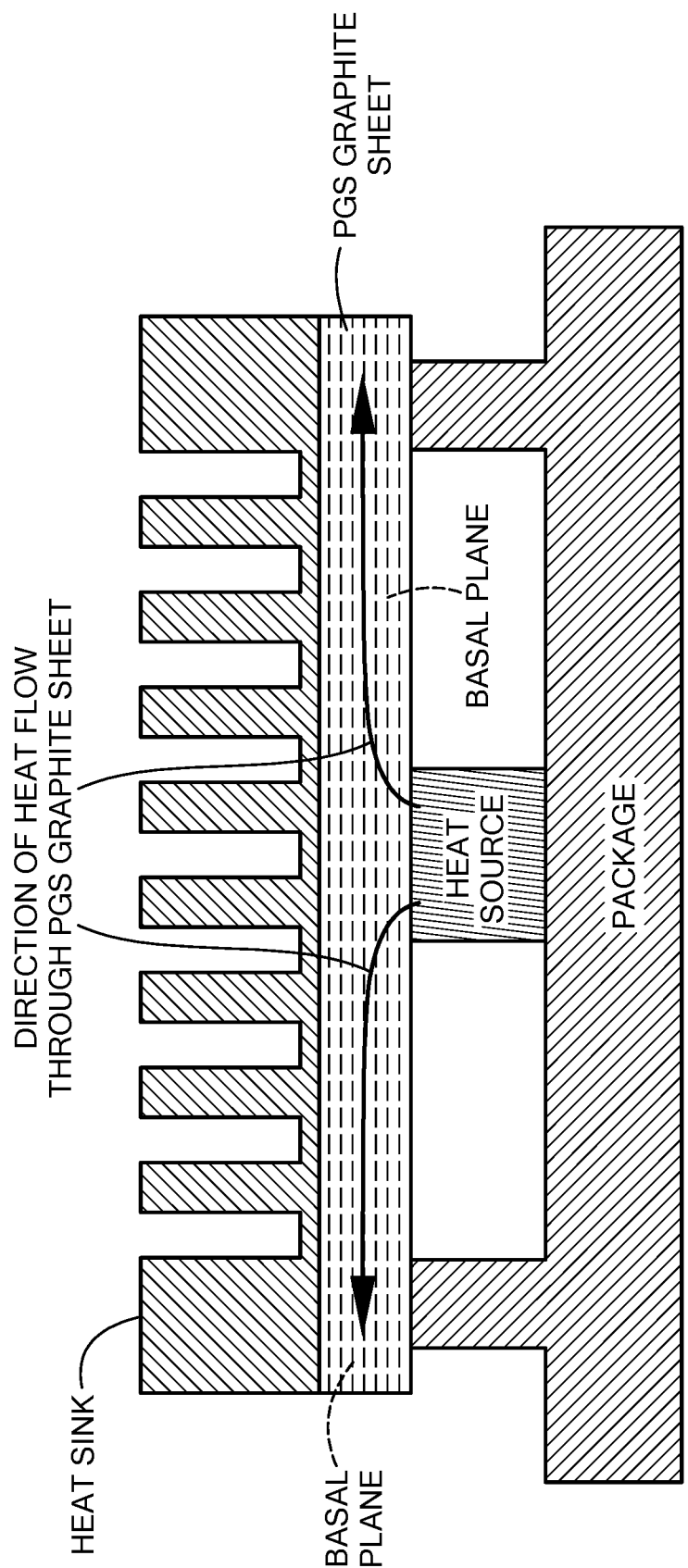
FIG. 1D is a cross sectional diagrammatical sketch of a cooling system using a Pyrolytic Graphite Sheets (PGS) graphite heat spreader according to the PRIOR ART.
Figure 2:
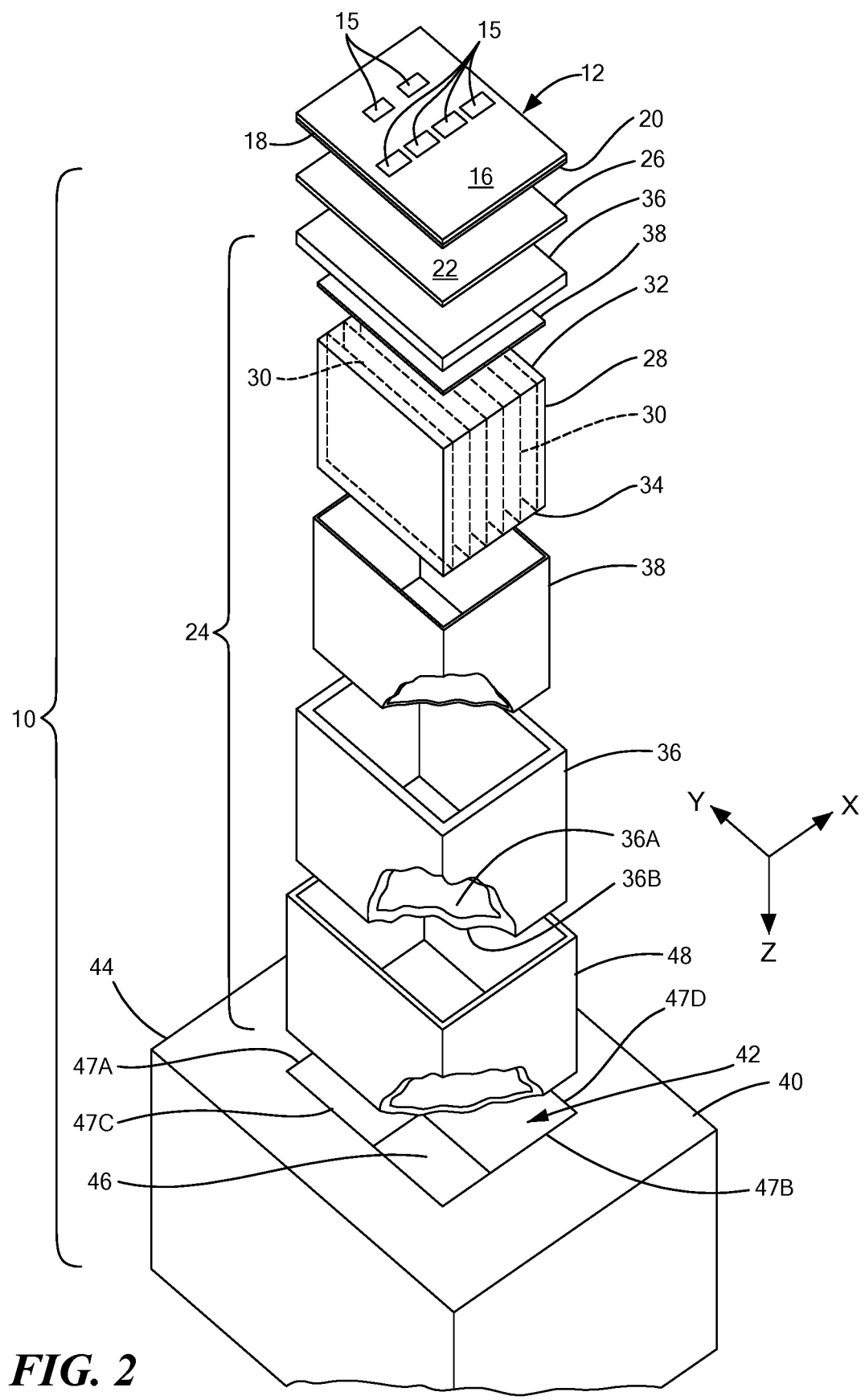
FIG. 2 is an exploded, perspective diagrammatical sketch, with portions of several elements thereof being partially broken away to show portions of bottom surfaces of such elements, of a cooling structure for cooling a Monolithic Integrated Circuit (MMIC) according to the disclosure.
Figure 3:
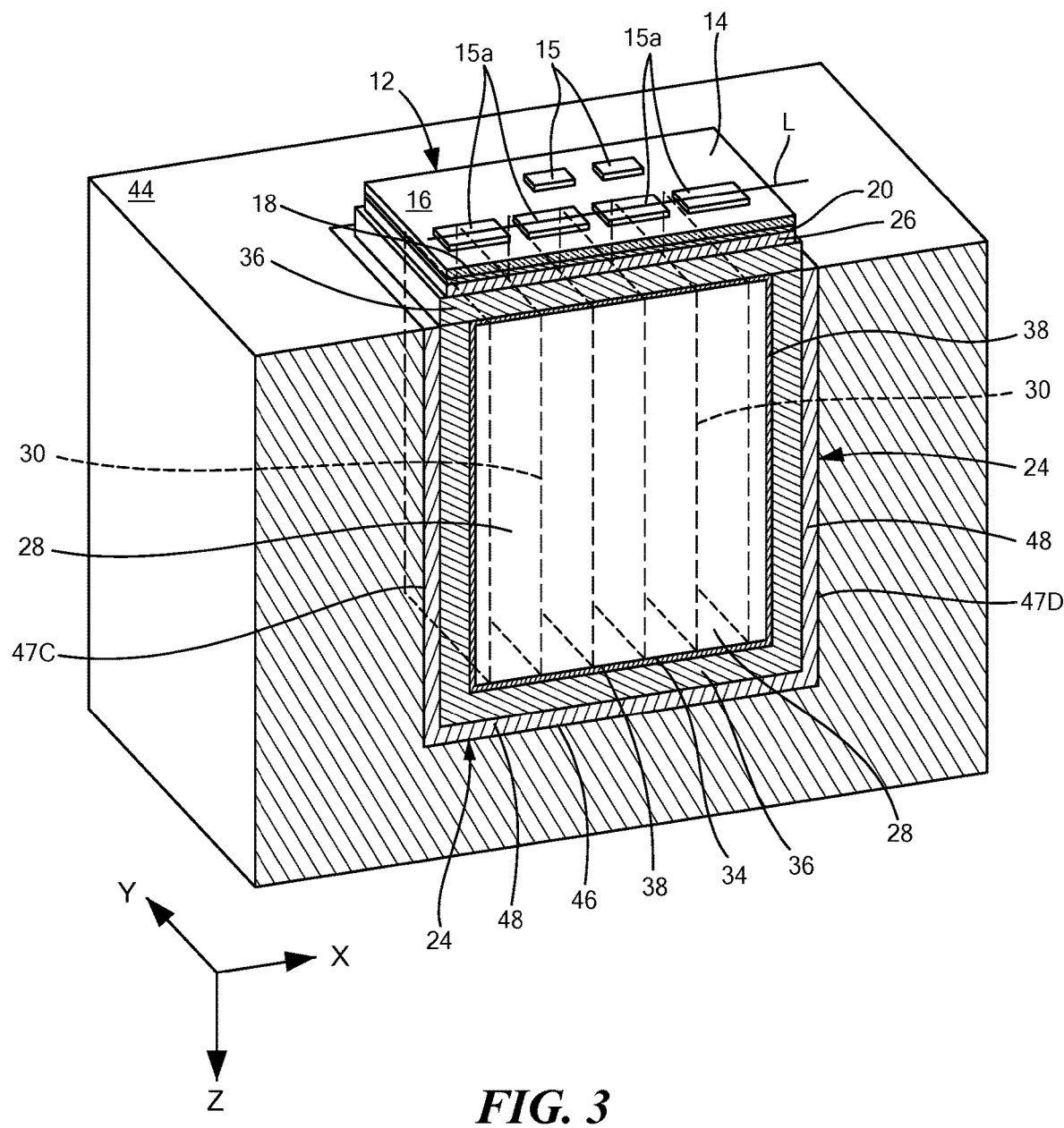
FIG. 3 is an assembled, perspective, cross sectional diagrammatical sketch of the Monolithic Integrated Circuit (MMIC) cooling structure of FIG. 2 according to the disclosure.
Figure 4A:
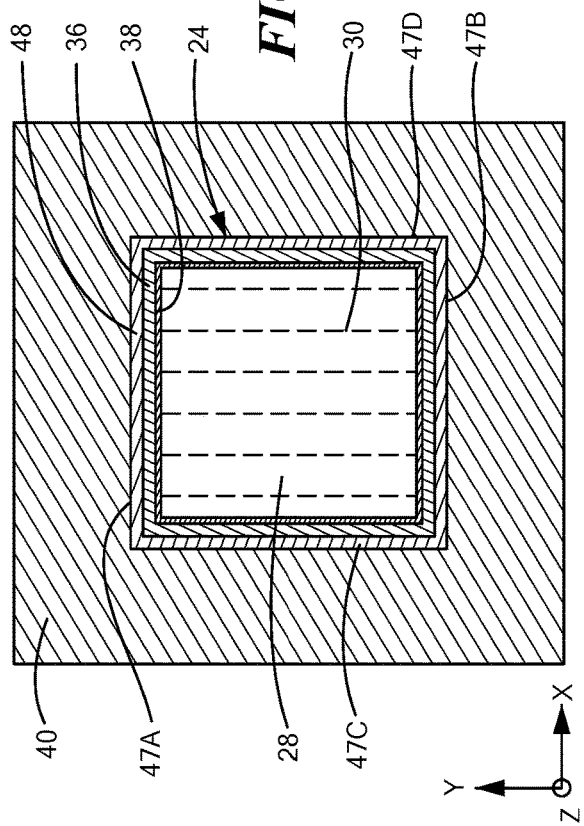
FIGS. 4A, 4B and 4C are top and side cross sectional views of the Monolithic Integrated Circuit (MMIC) cooling structure of FIG. 2 according to the disclosure.
Figure 4B:
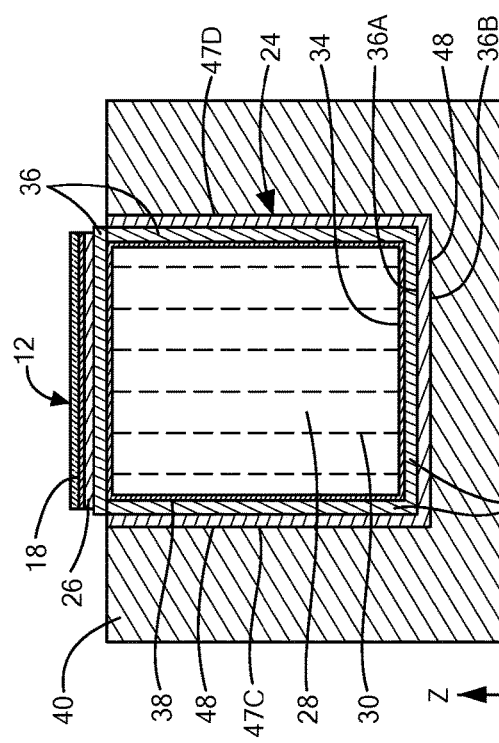
Figure 4C:
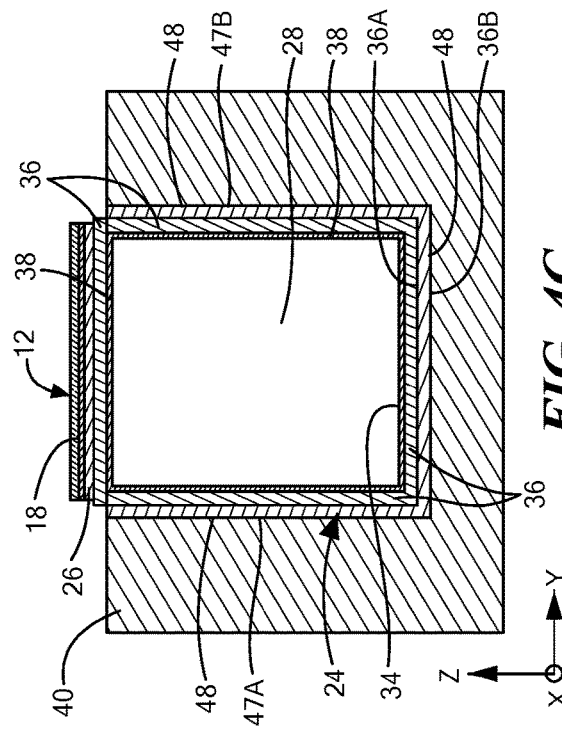
Figure 5A:
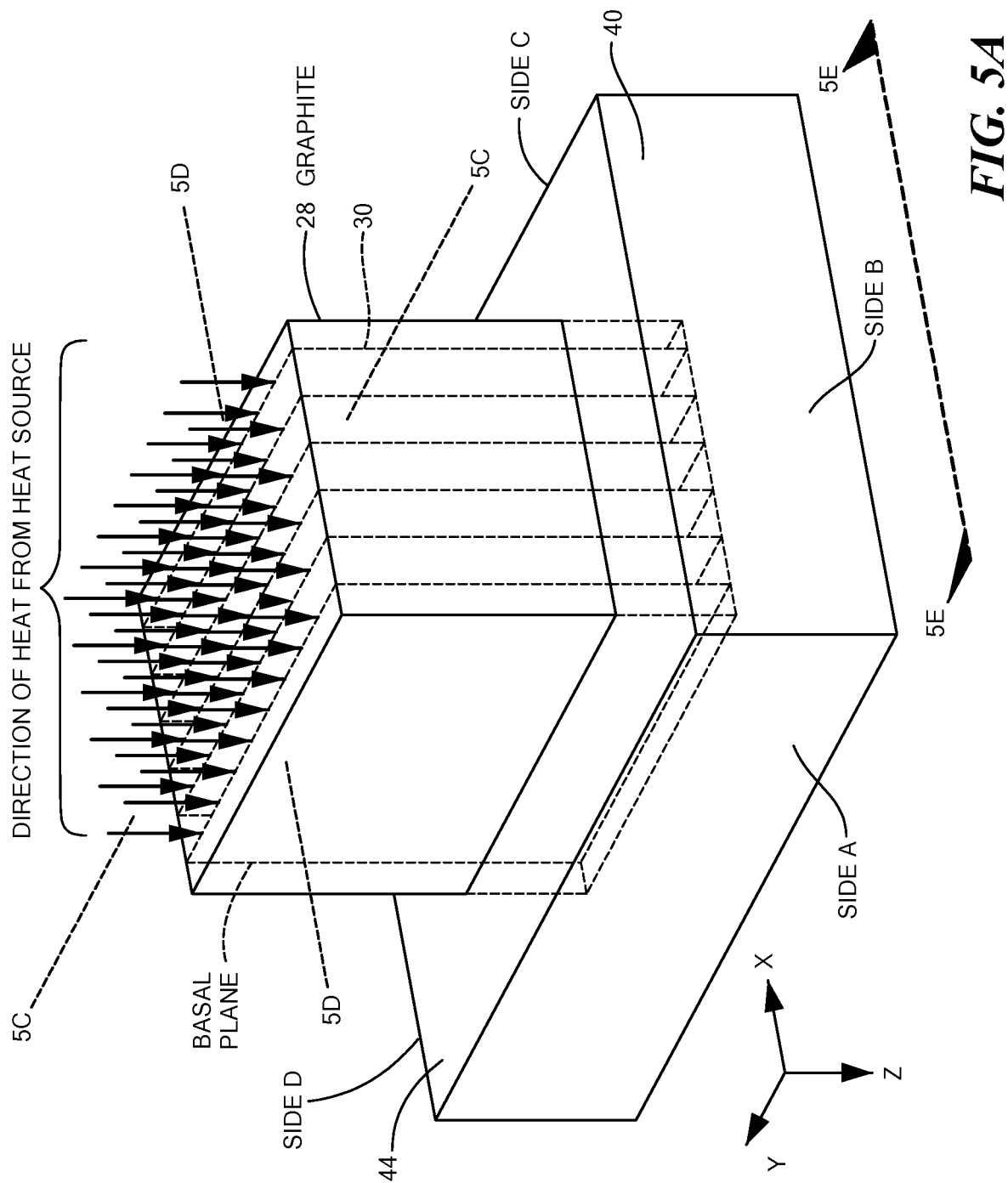
FIGS. 5A-5E are schematic diagrams of heat flow, indicated by arrows with the symbol "X" in FIG. 5B indicating a flow of heat from a heat source, such as a MMIC, into the plane of the paper in FIG. 5B, through the Monolithic Integrated Circuit (MMIC) cooling structure of FIG. 2 according to the disclosure.
Figures 5B, 5C:
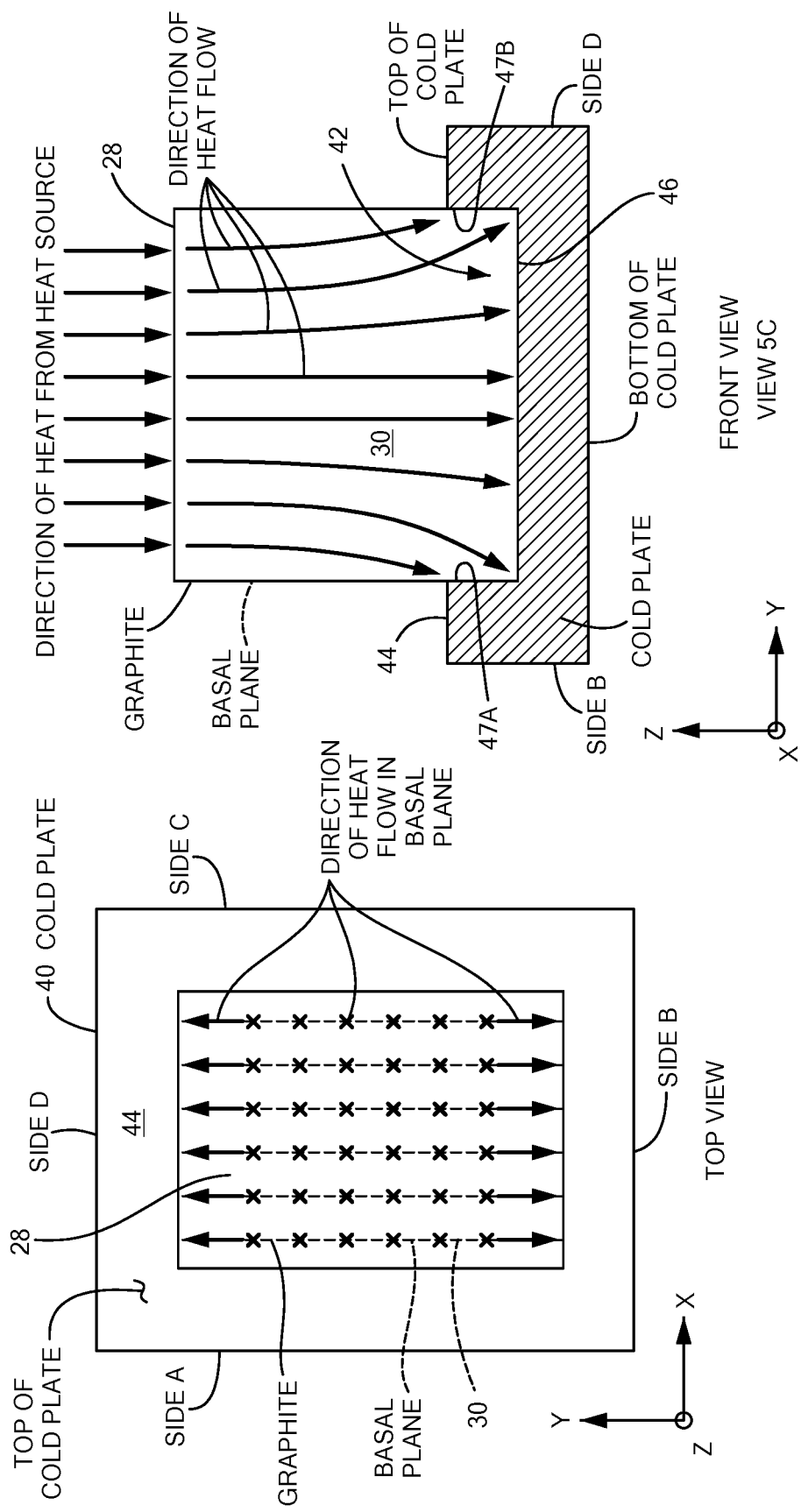
Figure 5E:
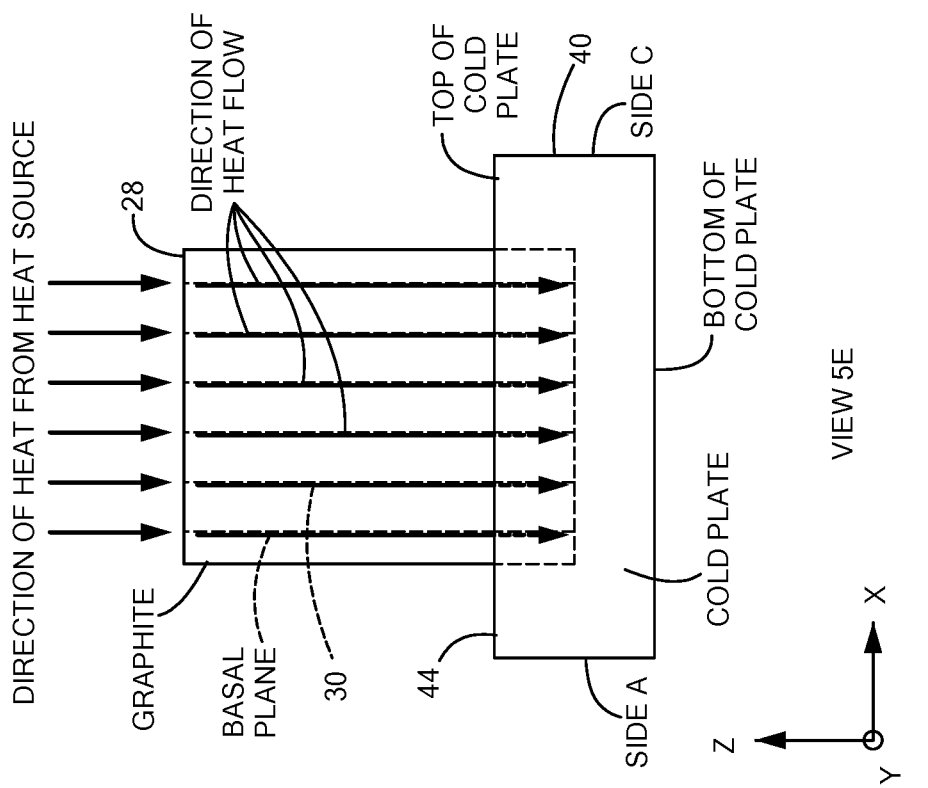
Figure 5D:
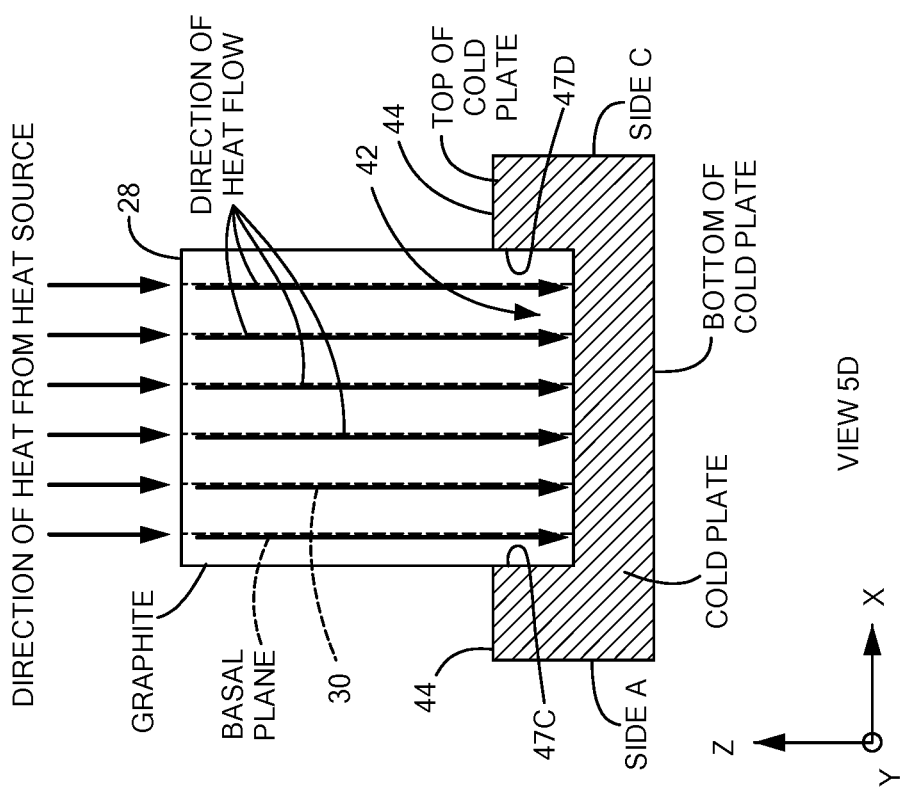

Referring now to FIGS. 2, 3, and 4A-4C, a Monolithic Integrated Circuit (MMIC) cooling structure 10 is shown for a MMIC 12. The MMIC 12 is any conventional MMIC having a substrate 14 (FIG. 3), such as Gallium Arsenide, Gallium Nitride, Silicon, or Silicon Carbide, having devices 15, more particularly, active, heat generating devices, such as transistors indicted by the designation 15a, arranged to form power amplifiers, formed in a semiconductor region of an upper surface 16 of the substrate 14, and passive devices, such as transmission lines, resistors, inductors, and capacitors, formed on the upper surface 16 of the substrate 14, with the active and passive devices 15 interconnected with microwave transmission lines, not shown, formed on an upper surface 16 of the substrate 14 of MMIC 12. A planar, bottom surface 18 of the substrate 14 of MMIC 12, has an optional ground plane conductor 20, such as gold or copper, to provide a ground plane conductor for the MMIC 12. The ground plane conductor 20 or the bottom surface 18 of the MMIC 12 is bonded to a planar, upper surface 22 (FIG. 2) of the cooling structure 10 with a first layer 26 of a thermal interface material (TIM); here for example the layer 26 of solder or thermally conductive adhesive. Thus, as shown in FIG. 2, the upper and lower surface 16 and 18, and optional ground plane conductor 20 of the MMIC 12 are disposed in the X-Y plane. The MMIC substrate 14 is, as noted above, for example, Gallium Arsenide, Gallium Nitride. Silicon, or Silicon Carbide and has a low coefficient of thermal expansion (CTE), as compared to many common metals. For example, the CTE of Silicon Carbide is close to 2.8 PPM/° C. (parts per million per degree Celsius) at room temperature, as compared to Copper metal, which is close to 18 PPM/° C. at room temperature.

The cooling structure 10 includes: a heat spreader 24 thermally bonded to a base 40, here a cold plate or heat sink, in a manner to be described. Suffice it to say here that the heat spreader 24, here, in this example, a cube-shaped block, includes a thermally anisotropic material 28, here for example pyrolytic graphite, having basal planes, indicated by dashed lines 30 disposed, in this example, in the Y-Z plane, that is, in this example, perpendicular to the upper surface 32 and the bottom surface 34 of the thermally anisotropic material 28. Thus, heat spreader 24 has anisotropic heat conducting properties for conducting heat therethrough along preferred planes (the basal planes 30). Here, the basal planes 30 intersect the bottom surface 18 of the MMIC 12 and hence also the optional ground plane conductor 20; here at ninety degree angles. It should be noted that while, in this example, the upper, or top, and lower, or bottom, surfaces 32, 34 of the thermally anisotropic material 28, are in the X-Y plane, the basal planes 30 may be in the X-Z plane, or one portion of the basal planes may be in the Y-Z plane and another portion may be in the X-Z plane. It is noted in FIG. 3 that a plurality of the active heat generating devices, here devices 15a, is disposed along a line L, such line L intersecting the basal planes 30, here being perpendicular to the basal planes 30, as shown. While here the active devices 15a are aligned perpendicular to the basal planes 30, it should be understood that other active device layouts are possible, for example, the active devices could all be parallel to the basal planes 30 or at an angle other than being parallel or perpendicular, for example, 45 degrees relative to the basal planes.

The heat spreader 24 includes a thermally conductive material 36, here for example a metal, such as cooper, to encase all six outer surfaces (top, bottom and four sides) of the thermally anisotropic material 28. More particularly, the six outer surface of the thermally anisotropic material 28 are brazed to the thermally conductive material 36 with a suitable brazing material 38, here for example, CuSil an alloy of 72% silver and 28% copper (±1%) marketed by Morgan Advanced Materials, Quadrant 55-57 High Street Windsor Berkshire, United Kingdom, SL4 1LP; a eutectic alloy primarily used for vacuum brazing. In another method of attachment, no external bonding agent is used between thermally anisotropic material 28 and thermally conductive material 36; for example using heat and pressure, such as thermo-compression bonding or hot isostatic pressing, for example. Thus, the thermally conductive material 36 is an encapsulating material used to encapsulate the thermally anisotropic material 28 and is sometimes also referred to herein as encapsulation material 36.

In addition, all six outer surfaces do not have to be made out of the same encapsulation material 36, especially the top surface of material 36, which has the TIM layer 26 disposed on it in FIG. 2, and can be a different material from the remaining five sides (bottom and four sides). In one example, the top surface of the encapsulation material 36, which has the TIM layer 26 disposed on it, can be made out of a high-thermal conductivity, but low CTE metal, such as Tungsten (4 PPM/° C.), Molybdenum (5.5 PPM/° C.), an alloy of Copper-Tungsten (5-10 PPM/° C.), an alloy of Copper-Molybdneum (6-10 PPM/° C.), or other such materials. In another example, this top surface of material 36 can be made out of a ceramic, for example, Aluminum-Nitride (4.5 PPM/° C.), or Silicon Nitride (3.5 PPM/° C.), or others, which also have high thermal conductivity and a lower CTE. In doing so, an attachment surface, that is, the top surface of encapsulation material 36 has a lower CTE, as compared to metal like Copper (18 PPM/° C.). Since the MMIC substrate 14 is made of, for example, Silicon Carbide, which has a lower CTE (2.8 PPM/° C.), the use of a high thermal conductivity with low CTE material on the top surface of encapsulation material 36 provides good thermal transport with improved CTE matching between the MMIC substrate 14 and the underlying heat spreader structure 24. A higher degree of CTE matching between the MMIC 12 and the underlying heat spreader structure 24, thus achieved, reduces thermal-induced stresses in the MMIC 12 and the active and passive devices 15a when the cooling structure 10 is exposed to temperature excursions during operation. Thus, improved CTE matching improves the mechanical reliability of the cooling structure 10 by lowering thermal-induced stresses. Better degree of CTE matching thus achieved, also helps increase the choice of materials available to be used for the TIM layer 26 because TIM layer 26 stresses are lowered. This further improves thermal transfer from the MMIC 12 into the base or cold plate 40 through the TIM layer 26. For example, if the CTE mismatch between the MMIC 12 and the top surface of the heat spreader 24, more particularly the top surface of encapsulating material 36, was higher, only a certain category of materials could be used for TIM layer 26 because, being disposed between the MMIC 12 and the top surface 36 of the encapsulation material of heat spreader 24, they would now be subjected to higher thermal-induced stresses. With better CTE matching between MMIC 12 and the heat spreader 24, a larger number of thermally higher performing TIM materials 26 become available as options. In this example, the remaining five sides of encapsulation, the four sides and the bottom, can be of Copper (18 PPM/° C.) and can be perfectly CTE-matched to a Copper base 40. Thus, improved CTE matching is achieved on all sides of the spreader by employing a combination of encapsulation materials rather than one single material. It is also possible to employ different materials for all or some of the remaining five sides, as dictated by the CTE matching and thermal transfer needs of a given application. Thus all or any of the six encapsulating sides can be made out of a metal or a non-metal, as noted above.

The cooling structure 10 includes, as noted above the thermally conductive base, here a cold plate, 40. The base or cold plate 40 is here copper having isotropic heat conducting properties. The base 40 has a recess or cavity 42 formed in the upper or top surface 44, as shown. As noted above, in this example the heat spreader 24 is a cube. Thus, the cavity 42 is formed with a bottom surface 46 disposed in the X-Y plane and a first pair of opposing side surfaces 47A, 47B disposed in the X-Z plane and a second pair of opposing side surfaces 47C, 47D in the Y-Z plane, as shown. The bottom portion of the heat spreader 24 is thus embedded into an upper surface 46 of the cavity 42 in the thermally conductive base 40, as shown. It is noted that the side surfaces 47A, 47B are here perpendicular to the basal planes 30 as shown more clearly in FIGS. 4A and 4C.

As noted above, the bottom surface 34 of the anisotropic material 28 here, in this example, also disposed in the X-Y plane, is disposed on and bonded to a planar surface, here the metal cladding surface 36 A. As noted above, this bond could utilize an external agent 38, for example, CuSiL alloy, or could utilize a thermo-compression facilitated attachment. The metal cladding surface 36B forms the bottom most surface of the spreader 24, is disposed on and bonded to a planar upper or top surface 46 of the cavity 42. More particularly, the bottom surface 36B of the heat spreader 24 is bonded to the surface 46 of the cavity 42 using a thermal interface material 48, here, for example solder. Thus, here, the thermally anisotropic material 28 is disposed within a thermally conductive housing or base 40, here for example a thermally isotropic material, here for example a metal such as copper. The thermally conductive base 40 has the cavity 42 in an upper surface 44 of the base 40 with lower portions of the four sides of the head spreader 24 being bonded to four sides 47A, 47B, 47C and 47D of the cavity 42 within the thermally conductive base 40 with the second layer 48 of a thermal interface material, here for example, solder.

To put it another way, all four sides of the heat spreader 24 are bonded to all four sides 47A, 47B, 47C and 47D respectively of the cavity 42 and the bottom of the spreader, surface 36B, is bonded to the top surface 46 of the cavity 42 using a thermal interface material 48, here, for example solder. As noted above, the CTE of the thermally conductive encapsulation materials on all of the six encapsulated sides are selected in accordance with the CTE of the MMIC substrate 14 and in accordance with the CTE of the base 40, to reduce thermally induced mechanical stresses over changes in the temperature of the cooling structure 10 during operation of the MMIC 12.

Referring now also to FIGS. 5A-5E, the direction of the heat flow from a heat source, here the MMIC 12, to the base or heat sink 40 of the a Monolithic Integrated Circuit (MIMIC) cooling structure 10 described above in connection with to FIGS. 2, 3, and 4A-4C is shown by arrows. As noted above, the side surfaces 47A, 47B are here perpendicular to the basal planes 30 as shown more clearly in FIGS. 4A and 4C. It is noted in FIG. 5C that the heat flows from the MMIC 12 to the base 40 is in the basal planes 30 and more particularly flows to the sides 47A, 47B of the base 40 perpendicular to the basal planes 30 and therefore the side surfaces 47A, 47B are disposed in planes intersecting the basal planes 30; the preferred plane of the heat flow.

Figure 6:
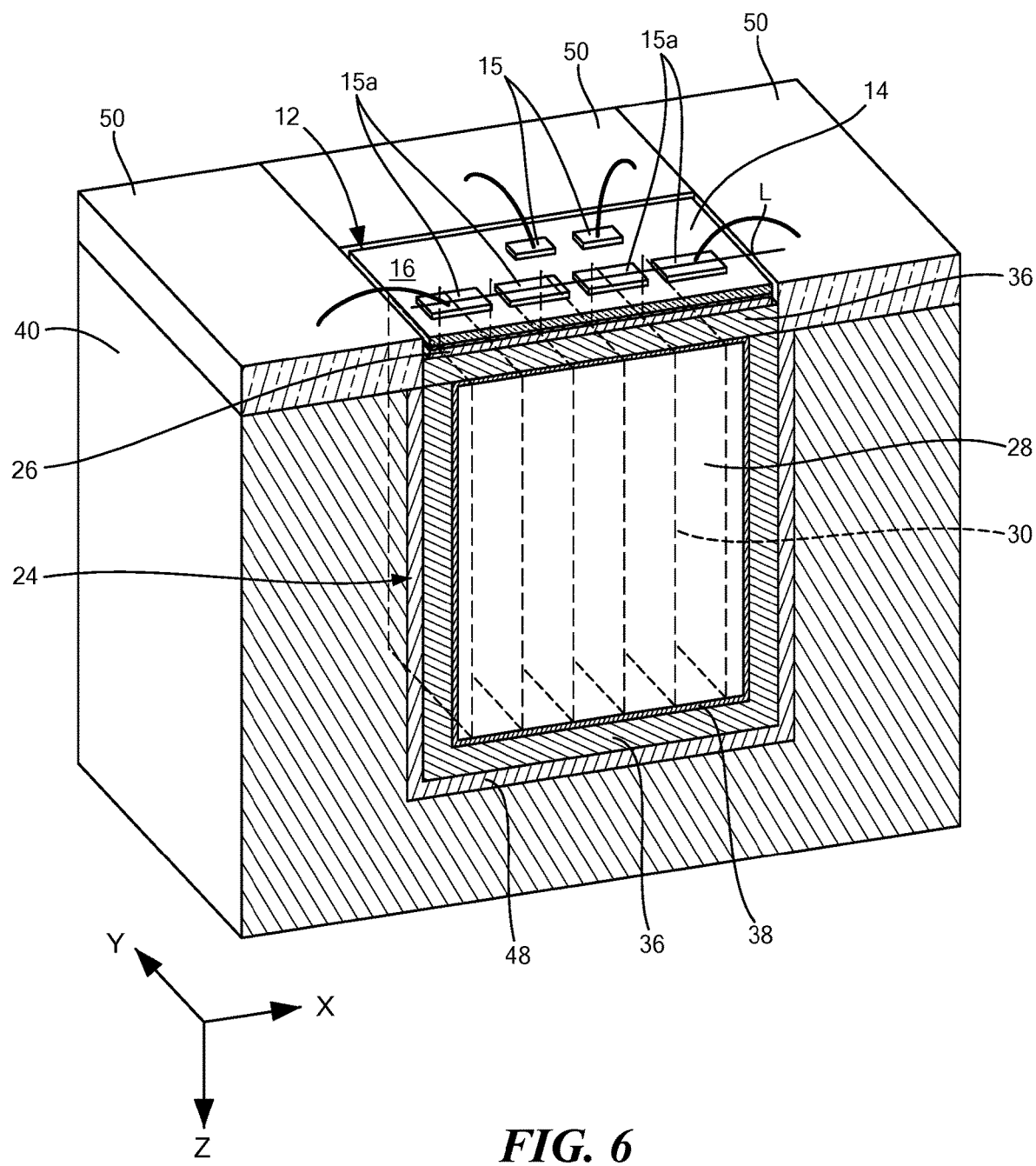
FIG. 6 is an assembled, perspective, cross sectional diagrammatical sketch of the Monolithic Integrated Circuit (MMIC) cooling structure of FIG. 2 having additional circuit mounted thereon and adapted for connection to the MMIC according to the disclosure.
Figure 7:
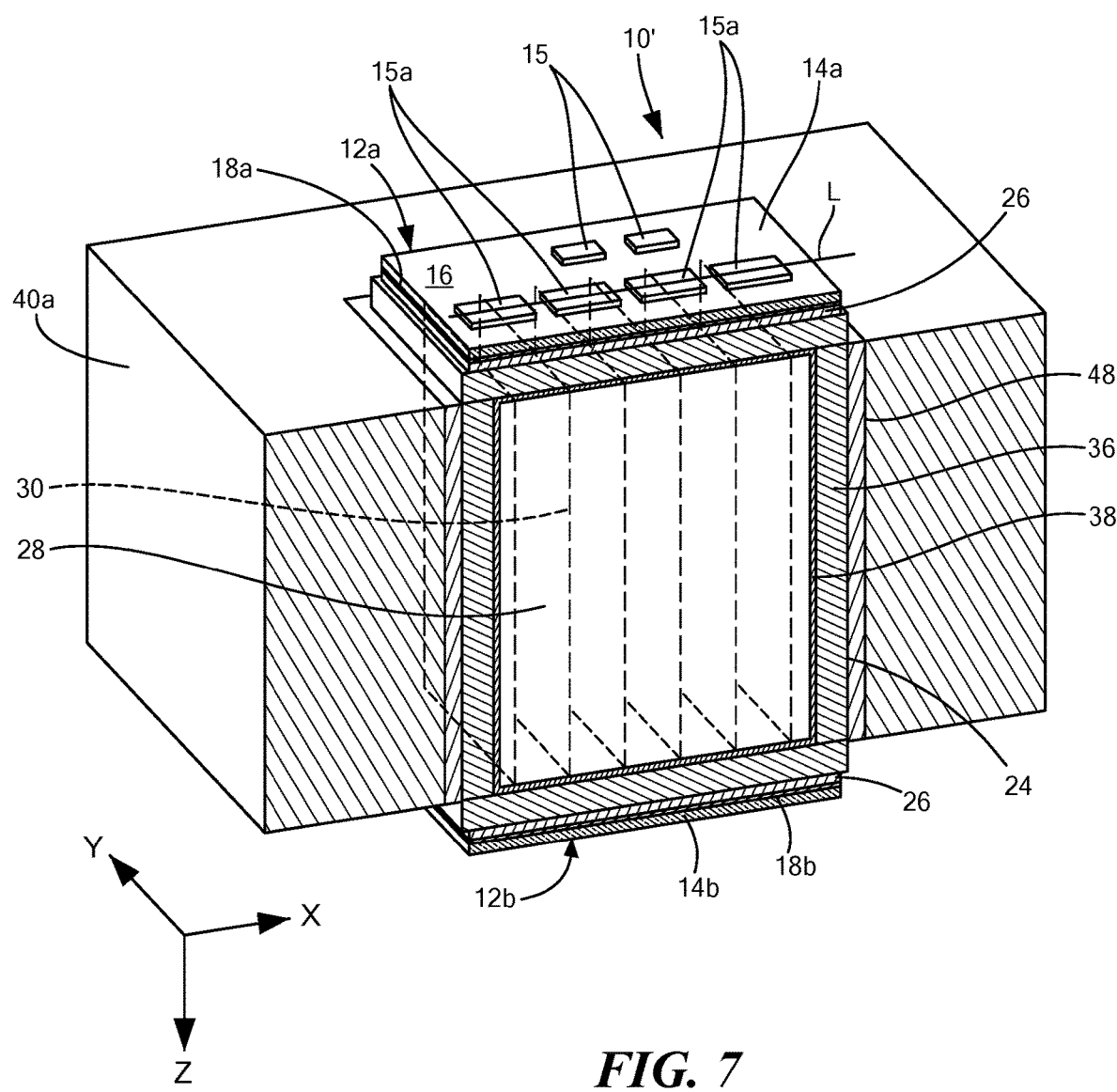
FIG. 7 is an assembled, perspective, cross sectional diagrammatical sketch of the Monolithic Integrated Circuit (MMIC) cooling structure adapted to cool a pair of MMICs mounted to opposite sides of the cooling structure according to another embodiment of the disclosure.

Referring now to FIG. 6, the Monolithic Integrated Circuit (MMIC) cooling structure 10 described above in connection with FIGS. 2, 3, and 4A-4C, includes circuitry 50 wire bonded to the devices on the upper surface of the MMIC 12, as shown. It is noted that typically the circuitry 50 does not dissipate as much heat flux as the MMIC, therefore it does not require a heat spreader such as heat spreader like 24.

Referring now to FIGS. 7, 7A-7C another embodiment of a Monolithic Integrated Circuit (MMIC) cooling structure 10' is shown. Here, the structure 10' is configured to cool a pair of MMICs 12a, 12b; MMIC 12a having a bottom surface 18a of substrate 14a thermally coupled to the upper surface of the heat spreader 24 and MMIC 12b having a bottom surface 18b of substrate 14b thermally coupled to the bottom surface of the heat spreader 24. It is noted that here the base 40a is the same material as the base 40 described above, except here the base 40a does not have a cavity as base 40 but rather has the four sides 47A, 47B, 47C, 47D thermally bonded to the four outer sides of the heat spreader 24, as shown. As noted above, the side surfaces 47A, 47B are again here perpendicular to the basal planes 30 as shown more clearly in FIGS. 7A and 7C. It is noted in FIG. 7C that the heat flows from the both MMICs 12a, 12b to the base 40a is in the basal planes 30 and more particularly flows to the sides 47A. 47B of the base 40a perpendicular to the basal planes 30 and therefore the side surfaces 47A, 47B are disposed in planes intersecting the basal planes 30; the preferred plane for the heat flow. Thus, both the MMICs 12a, and 12b have bottom surfaces 18a, 18b thermally coupled to the heat spreader 24, here to opposite surfaces of the heat spreader 24, with the preferred planes (the basal planes 30) intersecting the bottom surfaces of both the MMICs 12a, 12b.

Figure 8:
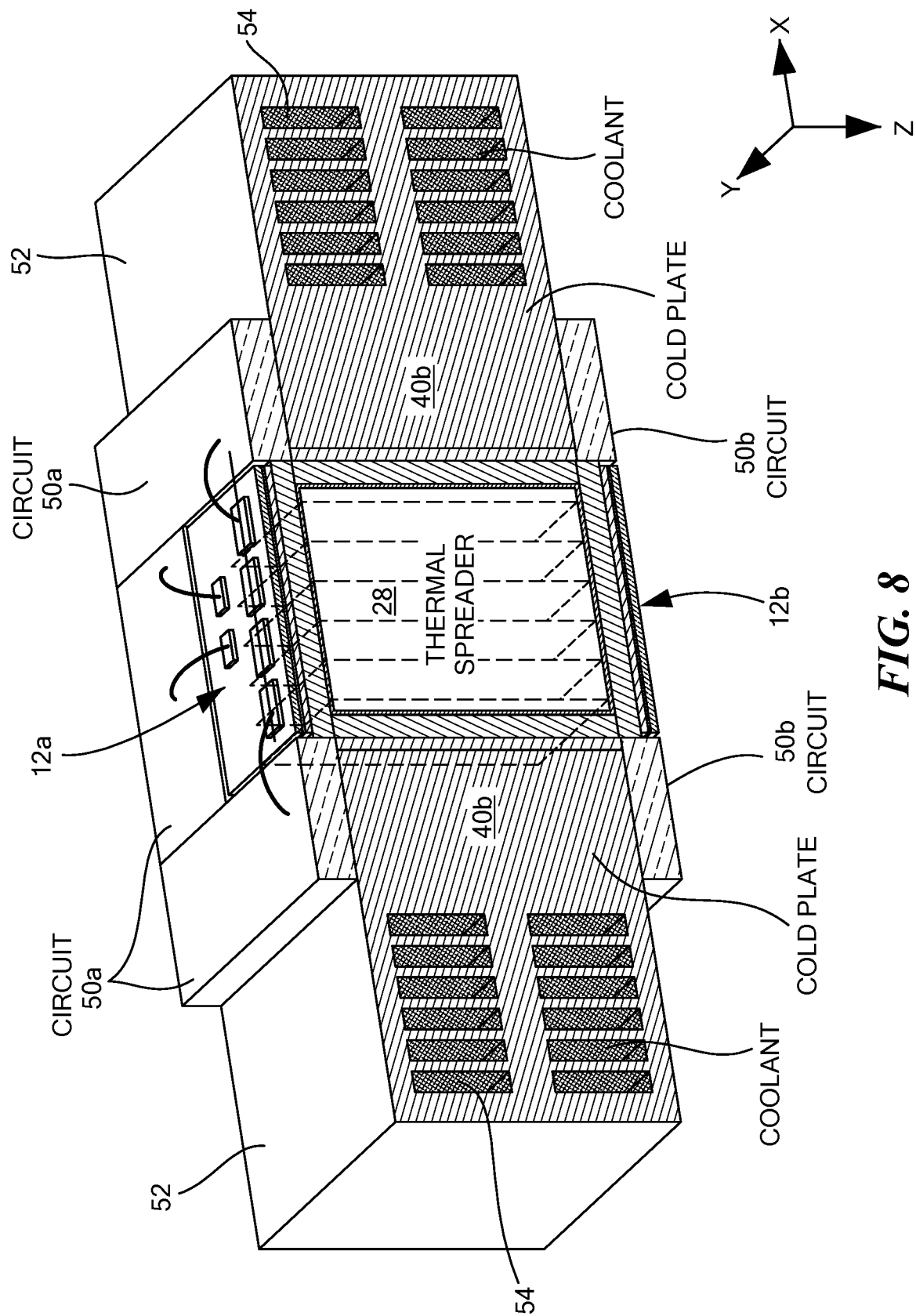
FIG. 8 is an assembled, perspective, cross sectional diagrammatical sketch of the Monolithic Integrated Circuit (MMIC) cooling structure adapted to cool a pair of MMICs mounted to opposite sides of the cooling structure of FIG. 7, the conductive base having integrated coolant flow channels to further facilitate the removal of heat from the conductive base, now a cold plate according to the disclosure.

Referring now to FIG. 8, the Monolithic Integrated Circuit (MMIC) cooling structure 10' described above in connection with FIGS. 7, 7A-7C includes circuitry 50a, 50b wire bonded to the devices on the upper surface of the MMICs 12a, 12b, respectively, as shown. It is noted that the base 40b here is the same material as base 40a in FIG. 7, except that coolant flow channels 54 have been machined into base 40a of FIG. 7. Hence, the base 40b, becomes a cold plate capable of dissipating heat without relying on externally added means of heat removal through coolant flow, for example, an external cooling manifold. It is noted that the cooling system shown in FIG. 8 may be mounted within a chasses by any one of a variety of mounting arrangements such as, for example, vertically in a rack mounting arrangement.

A number of embodiments of the disclosure have been described. Nevertheless, it will be understood that various modifications may be made without departing from the spirit and scope of the disclosure. For example, while here the bottom portion of the heat spreader 24 is square, it might be tapered, or may be of a different geometric shape having square or rectangular surfaces in the X-Y plane; or circular or oval of any irregular closed form including pentagon, hexagon, or octagon, for example.

Accordingly, other embodiments are within the scope of the following claims.

What is claimed is:

1. A cooling structure, comprising:
   a heat generating electronic component;
   a heat spreader, comprising:
      a thermally anisotropic material for conducting heat along a preferred plane, a surface of the heat generating electronic component being disposed on, and thermally coupled to, a surface portion of the thermally anisotropic material, the preferred plane intersecting the surface of the heat generating electronic component; and,
      a thermally conductive structure encapsulating the thermally anisotropic material, inner walls of the thermally conductive structure being bonded to, and thermally coupled to, outer walls of the thermally anisotropic material; and,
   a thermally conductive base having a side portion thermally coupled to, and bonded to, outer walls of the thermally conductive structure, the side portion being disposed in a plane intersecting the preferred plane.

2. The cooling structure recited in claim 1 wherein the heat generating electronic component is a first heat generating electronic component,
   including a second heat generating electronic component, wherein the first heat generating electronic component and the second heat generating electronic component are disposed in different, spaced overlying planes.

3. The cooling structure recited in claim 1 including a heat conducting bonding layer for bonding the thermally anisotropic material to the thermally conductive structure.

4. The cooling structure recited in claim 3 wherein the thermally anisotropic material is bonded to the thermally conductive structure using temperature and pressure.

5. The cooling structure recited in claim 3 wherein the thermally conductive structure comprises a material having a coefficient of thermal expansion selected in accordance with a coefficient of thermal expansion of a substrate of the heat generating electronic component.

6. The cooling structure recited in claim 3 wherein the thermally conductive structure comprises a material having a coefficient of thermal expansion selected in accordance with a coefficient of thermal expansion of the thermally conductive base.

7. The cooling structure recited in claim 1 wherein the heat spreader has a basal plane and wherein the preferred plane is in the basal plane.

8. The cooling structure recited in claim 1 wherein the heat generating electronic component is a Monolithic Microwave Integrated Circuit (MMIC).

9. The cooling structure recited in claim 8 including a second MMIC, a surface of the second MMIC being thermally coupled to the heat spreader, the preferred plane intersecting the surface of the second MMIC.

10. The cooling structure recited in claim 8 wherein the thermally anisotropic material is encapsulated within the thermally conductive structure.

11. The cooling structure recited in claim 10 wherein the thermally conductive structure comprises a thermally conductive encapsulation material; and a heat conducting bonding layer for bonding the thermally anisotropic material to the thermally conductive structure.

12. The cooling structure recited in claim 10 wherein the thermally conductive structure comprises: a thermally conductive encapsulation material; and wherein the thermally anisotropic material is bonded to the thermally conductive structure using temperature and pressure.

13. The cooling structure recited in claim 10 wherein the thermally conductive structure comprises a material having a coefficient of thermal expansion selected in accordance with a coefficient of thermal expansion of a substrate of the heat generating electronic component.

14. The cooling structure recited in claim 10 wherein the thermally conductive structure comprises a material having a coefficient of thermal expansion selected in accordance with a coefficient of thermal expansion of the thermally conductive base.

15. The cooling structure recited in claim 10 wherein the thermally conductive base comprises a thermal isotropic material.

16. The cooling structure recited in claim 10 wherein the heat spreader has a basal plane and wherein the preferred plane is in the basal plane.

17. The cooling structure recited in claim 8 wherein the heat spreader is embedded into a surface of the thermally conductive base.

18. The cooling structure recited in claim 17 including a thermal interface layer for bonding the heat spreader to the base.

19. A cooling structure, comprising:
a heat generating electronic component having a bottom surface;
a heat spreader, comprising:
a thermally anisotropic material for conducting heat along a preferred plane, the thermally anisotropic material including outer surfaces including sides, a top surface portion and a bottom surface, the bottom surface of the heat generating electronic component being disposed on, and thermally coupled to the top surface portion of the thermally anisotropic material, the preferred plane intersecting the bottom surface of the heat generating electronic component; and,
a hollow, thermally conductive, encapsulating structure including inner walls, a top layer having an inner top surface and an outer top surface, and outer walls, the thermally anisotropic material being disposed within the inner walls of the encapsulating structure, the inner walls being bonded to, and thermally coupled to, the sides of the thermally anisotropic material, the outer top surface of the encapsulating structure being bonded to, and thermally coupled to, the bottom surface of the electronic component, the inner top surface of the encapsulating structure being disposed over the top surface portion of the thermally anisotropic material, the inner top surface of the thermally encapsulating structure being bonded to, and thermally coupled to, the top surface portion of the thermally anisotropic material; and,
a thermally conductive base having inner sides thermally coupled to the outer walls of the encapsulating structure,
wherein the top layer of the encapsulating structure having a material different from at least one of the inner walls of the encapsulating structure,
wherein at least one of the inner sides of the thermally conductive base being disposed in a plane intersecting the preferred plane.

20. The cooling structure recited in claim 19 wherein the heat generating electronic component comprises a plurality of active, heat generating devices disposed on an upper surface of the heat spreader, such plurality of active, heat generating devices being disposed along a line, such line intersecting the preferred plane.

21. The cooling structure recited in claim 19 including a second heat generating electronic component, a surface of the second heat generating electronic component being thermally coupled to the heat spreader, the preferred plane intersecting the surface of the second heat generating electronic component.

22. The cooling structure recited in claim 19 wherein the heat generating electronic component is a Monolithic Microwave Integrated Circuit (MMIC).

23. The cooling structure recited in claim 22 including a plurality of active, heat generating devices disposed on the surface portion of the heat spreader, such plurality of active, heat generating devices being disposed along a line, such line intersecting the preferred plane.

24. The cooling structure recited in claim 22 including a second heat generating electronic component, a surface of the second heat generating electronic component being thermally coupled to the heat spreader, the preferred plane intersecting the surface of the second heat generating electronic component.

25. The structure of claim 19 wherein the encapsulating structure further including an inner bottom surface and an outer bottom surface,
wherein the inner bottom surface of the thermally conductive encapsulating structure being disposed under the bottom surface of the thermally anisotropic material, the inner bottom surface of the thermally conductive structure being bonded to, and thermally coupled to, the bottom surface of the thermally anisotropic material,
a thermally conductive base having an inner bottom surface thermally coupled to the outer bottom surface of the encapsulating structure.

26. A cooling structure, comprising:
a heat generating electronic component;
a heat spreader having anisotropic heat conducting properties for conducing heat therethrough along a preferred plane, a surface of the heat generating electronic component being bonded to an upper surface of the heat spreader with a first layer of a thermal interface material, the conducting properties for conducting heat therethrough along the preferred plane intersecting the surface of the heat generating electronic component; and a thermally conductive base having isotropic heat conducting properties, the thermally conductive base having a cavity in an upper surface, wherein a surface of the heat spreader different from the upper surface of the heat spreader is bonded to sidewall surfaces of the cavity of the thermally conductive base with a second layer of a thermal interface material.

27. The cooling structure recited in claim 26 wherein the heat generating electronic component is a Monolithic Microwave Integrated Circuit (MMIC).

28. A cooling structure, comprising:
a heat generating electronic component;
a heat spreader having a surface portion having anisotropic heat conducting properties for conducting heat through the surface portion along a preferred plane, a surface of the heat generating electronic component being bonded to the surface portion of the heat spreader with a first layer of a thermal interface material, the conducting properties conducting heat through the surface portion along the preferred plane intersecting the surface of the heat generating electronic component;
a thermally conductive base having isotropic heat conducting properties, the base having an opening in an upper surface, wherein a surface of the heat spreader, different from an upper surface of the heat spreader, is bonded to sidewall surfaces of the opening of the thermally conductive base with a second layer of a thermal interface material.

29. The cooling structure recited in claim 28 wherein the heat generating electronic component is a Monolithic Microwave Integrated Circuit (MMIC).

30. The structure recited in claim 28 wherein a thermally anisotropic material of the heat spreader and the thermally conductive base are made of different materials.

31. A cooling structure comprising:
a heat generating electronic component having an upper surface and an opposing bottom surface, the heat generating electronic component having an active, heat generating device formed in the upper surface;
a heat spreader having a surface portion comprising an anisotropic material, such material having anisotropic heat conducting properties for conducting heat through the surface portion in a preferred plane, the bottom surface of the heat generating electronic component being disposed on, and thermally coupled to, the heat spreader, the preferred plane intersecting the bottom surface of the heat generating electronic component; and,
a thermally conductive base having a side portion thermally coupled to the heat spreader, the side portion being disposed in a plane intersecting the preferred plane.

32. The cooling structure recited in claim 31 wherein the heat generating electronic component is a Monolithic Microwave Integrated Circuit (MMIC).

33. The structure recited in claim 31 wherein the thermally anisotropic material and the thermally conductive base are made of different materials.

34. A cooling structure, comprising:
a heat generating electronic component;
a heat spreader having a surface portion with anisotropic heat conducting properties for conducting heat through the surface portion along a preferred plane, a surface of the heat generating electronic component being bonded to an upper surface of the heat spreader, the heat conducting properties for conducting heat through the surface portion along the preferred plane, the preferred plane of the surface portion intersecting the surface of the heat generating electronic component;
a thermally conductive base having isotropic heat conducting properties, the base having an opening in an upper surface, wherein a surface of the heat spreader, different from the upper surface of the heat spreader, is bonded to sidewall surfaces of the opening of the thermally conductive base with a thermal interface material.

35. The cooling structure recited in claim 34 wherein the thermally conductive base comprises integrated coolant flow channels.

36. The cooling structure recited in claim 34 wherein the heat generating electronic component is a Monolithic Microwave Integrated Circuit (MMIC).

37. The cooling structure recited in claim 36 wherein the thermally conductive base comprises integrated coolant flow channels.

38. The structure recited in claim 34 wherein a thermally anisotropic material of the heat spreader and the thermally conductive base are made of different materials.

39. A structure, comprising:
a three-dimensional, thermally conductive support structure comprising a heat spreader, the heat spreader comprising thermally anisotropic material, such material having anisotropic heat conducting properties for conducting heat through the heat spreader along a preferred plane, the three-dimensional, thermally conductive support structure comprising: a first plurality of sides, the first plurality of sides opposing one another along a first direction; and a plurality of second sides opposing one another along a second direction different from the first direction; and
a pair of heat generating components, each one of the pair of heat generating components having surfaces bonded and thermally coupled to an outer surface of a different one of the first plurality of sides of the three-dimensional, thermally conductive support structure.

40. The structure recited in claim 39 wherein the thermally anisotropic material conducts from the pair of heat generating components through the heat spreader along the preferred plane, such preferred plane intersecting the first plurality of sides, and directing such heat towards the second plurality of sides of the three-dimensional, thermally conductive support structure.

41. The structure recited in claim 39 wherein the thermally anisotropic material and the thermally conductive support structure are made of different materials.

* * * * *